United States Patent
Doller et al.

(10) Patent No.: US 9,491,558 B2
(45) Date of Patent: Nov. 8, 2016

(54) METHOD FOR TESTING SIGNAL-TO-NOISE RATIO USING A FILM FRAME

(71) Applicant: Robert Bosch GmbH, Stuttgart (DE)

(72) Inventors: Andrew J. Doller, Sharpsburg, PA (US); David Pravlik, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 38 days.

(21) Appl. No.: 14/580,453

(22) Filed: Dec. 23, 2014

(65) Prior Publication Data
US 2016/0183021 A1     Jun. 23, 2016

(51) Int. Cl.
*H04R 29/00* (2006.01)
*B81C 99/00* (2010.01)

(52) U.S. Cl.
CPC .......... *H04R 29/004* (2013.01); *H04R 29/005* (2013.01); *B81C 99/004* (2013.01); *B81C 99/0035* (2013.01); *B81C 99/0045* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 8,724,841 B2 | 5/2014 | Bright et al. | |
| 8,865,499 B2 | 10/2014 | Pahl et al. | |
| 2013/0039500 A1 | 2/2013 | Sridharan et al. | |
| 2014/0060146 A1 | 3/2014 | Zoellin et al. | |
| 2014/0076052 A1 | 3/2014 | Doller et al. | |
| 2014/0079229 A1 | 3/2014 | Doller et al. | |
| 2014/0299948 A1 | 10/2014 | Wang et al. | |
| 2015/0166335 A1* | 6/2015 | Loeppert | B81B 7/0064 438/51 |
| 2016/0088414 A1* | 3/2016 | Zheng | H04R 31/00 381/174 |

FOREIGN PATENT DOCUMENTS

WO    2012/004339    1/2012

OTHER PUBLICATIONS

International Search Report and Written Opinion for Application No. PCT/US2015/067310 dated Apr. 21, 2016 (10 pages).

* cited by examiner

*Primary Examiner* — Andrew L Sniezek
(74) *Attorney, Agent, or Firm* — Michael Best & Friedrich LLP

(57) ABSTRACT

A system and a method are provided for testing a MEMS microphone during manufacture by using a film to obstruct the acoustic ports of the microphone. The microphone testing is performed while the microphones are still in an array and mounted on a film frame. By performing the testing while the acoustic ports of the microphone are covered with film, unwanted, external noise is attenuated.

19 Claims, 4 Drawing Sheets

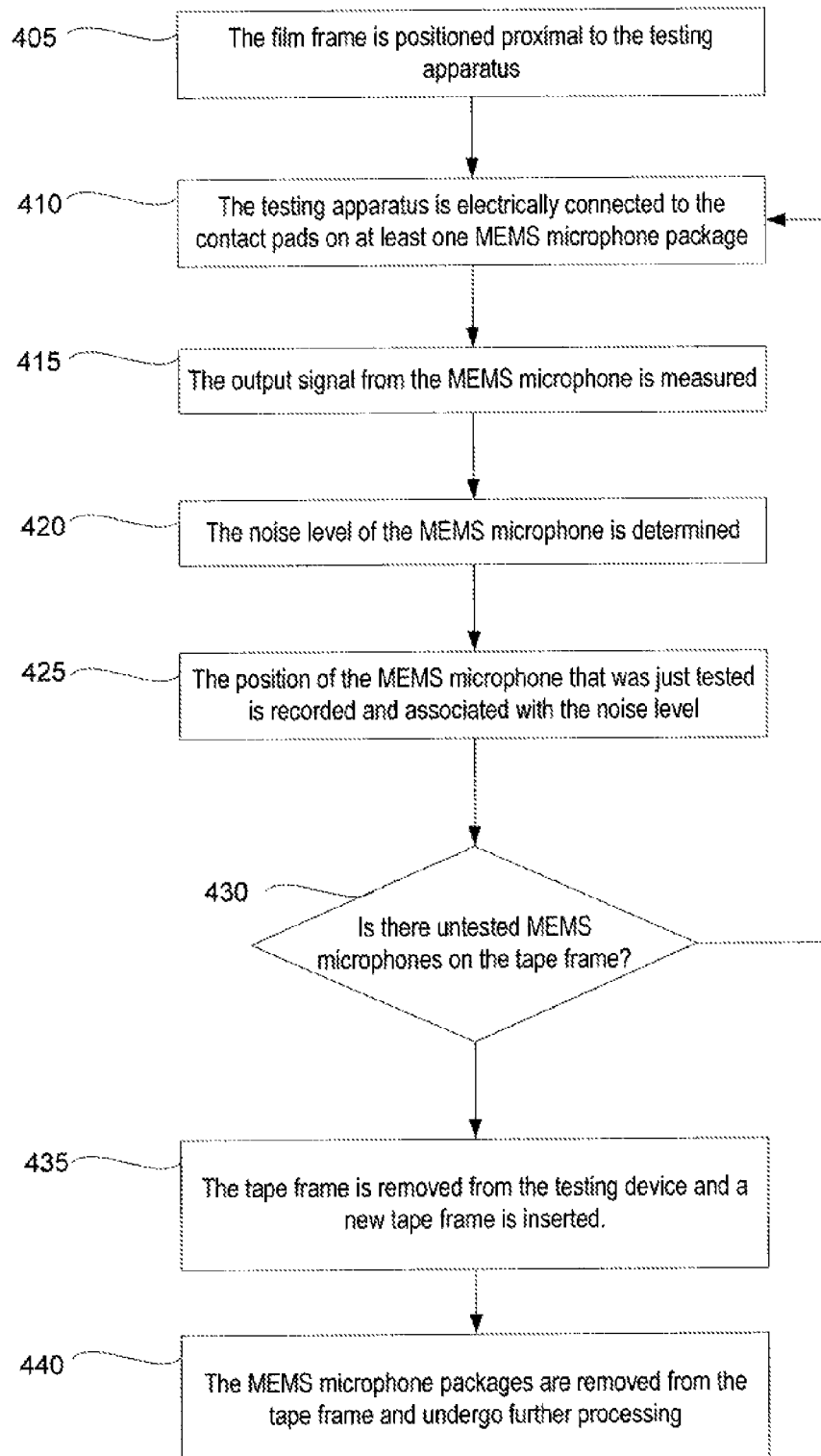

METHOD FOR TESTING SIGNAL-TO-NOISE RATIO USING A FILM FRAME

BACKGROUND

Embodiments of the invention relate to methods for testing a micro-electro-mechanical system (MEMS) microphone for noise in an output signal of the microphone.

SUMMARY

In one embodiment, the invention provides a method for noise testing a micro-electro-mechanical system (MEMS) microphone. The method includes positioning a film frame in a testing apparatus with a film adhered to an array of MEMS microphones and covering an acoustic port of each MEMS microphone in the array of MEMS microphones. An alignment socket connects to a substrate of the MEMS microphones and couples to one or more contact pads of each MEMS microphone to provide a power connection and a MEMS microphone output connection to each MEMS microphone. A control unit measures an output signal from the MEMS microphone output connection to obtain noise performance data and records the noise performance data in memory.

In another embodiment the invention provides a system for noise testing a microelectromechanical (MEMS) microphone. The system includes an array of MEMS microphones with a plurality of lids and a plurality of acoustic ports. A thin film attaches to a film frame, and the film adheres to a lid of each of the plurality of MEMS microphones. The film covers an acoustic port of each MEMS microphone in the array. A testing apparatus includes an alignment socket configured to connect to a plurality of contact pads located on a substrate of the MEMS microphones. The alignment socket provides power connections, ground connections, and MEMS microphone output connections to the MEMS microphones. A control unit is configured to measure the output signal from the MEMS microphone to obtain noise performance data.

Other aspects of the invention will become apparent by consideration of the detailed description and accompanying drawings.

BRIEF DESCRIPTION OF THE DRAWINGS

FIG. 5 is a flowchart illustrating a method of testing the array of MEMS microphones of FIG. 2.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It should be noted that a plurality of hardware and software based devices, as well as a plurality of different structural components may be used to implement embodiments of the invention. In addition, it should be understood that embodiments of the invention may include hardware, software, and electronic components or modules that, for purposes of discussion, may be illustrated and described as if the majority of the components were implemented solely in hardware. However, in at least one embodiment, the electronic based aspects of the invention may be implemented, at least in part, by software (e.g., instructions stored on non-transitory computer-readable medium) executable by and, ultimately, executed by one or more associated processors. It should also be noted that a plurality of hardware and software based devices, as well as a plurality of different structural components may be utilized to implement the invention. For example, "control units" and "controllers" described in the specification can include one or more processors, one or more memory modules including non-transitory computer-readable medium, one or more input/output interfaces, and various connections (e.g., a system bus) connecting the components.

Figure 1A:
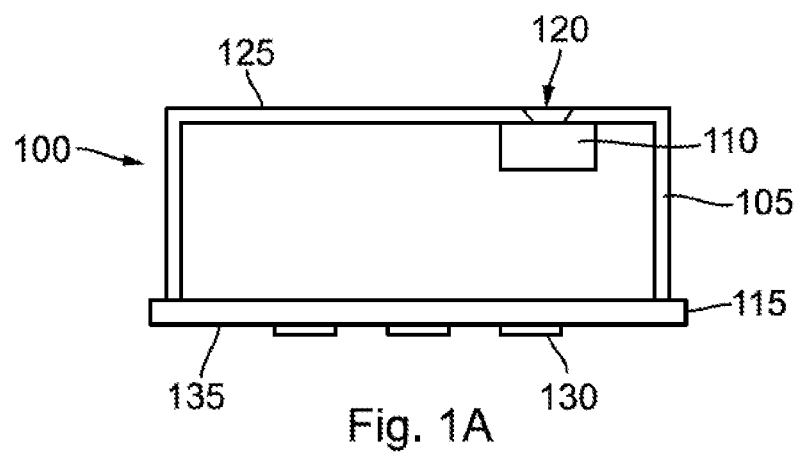
FIG. 1A is cross-sectional view of a top-ported MEMS microphone package.

FIG. 1A illustrates one example of a top-ported MEMS microphone 100. In this embodiment, the top-ported MEMS microphone 100 includes a lid 105, a MEMS microphone die 110, and a substrate 115. The substrate 115 is attached to the lid 105 to form a cavity that houses the MEMS microphone die 110. An acoustic port 120 is formed in a top surface 125 of the lid 105. The MEMS microphone die 110 is mounted proximal to the acoustic port 120 so that acoustic pressures (i.e., sound) enter the top-ported MEMS microphone 100 through the acoustic port 120 and interact with the microphone die 110. The microphone die 110 and associated electronics (not pictured) output an electronic signal representation of the acoustic pressure via contact pads 130 on a bottom surface 135 of the substrate 115.

Figure 1B:
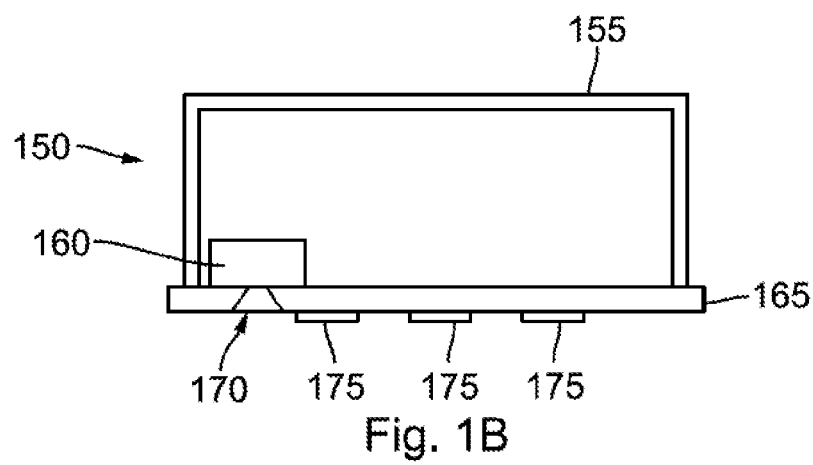
FIG. 1B is a cross-sectional view of a bottom-ported MEMS microphone package.

FIG. 1B illustrates one example of a bottom-ported MEMS microphone 150. Similar to the top-ported MEMS microphone 100, the bottom-ported MEMS microphone 150 includes a lid 155, a MEMS microphone die 160, and a substrate 165. The substrate 165 is attached to the lid 155 to form a cavity that houses the MEMS microphone die 160. In the bottom-ported configuration, an acoustic port 170 is formed in the substrate 165. The MEMS microphone die 160 is mounted proximal to the acoustic port 170. A plurality of contact pads 175 are located on the substrate 165. The contact pads 175 provide power and signal connections for the bottom-ported MEMS microphone 150. For the purposes of illustration, the contact pads are displayed as protruding from the surface of the substrate. However, in some embodiments, the contact pads 175 are flush with a bottom surface of the substrate 165.

Figure 2:
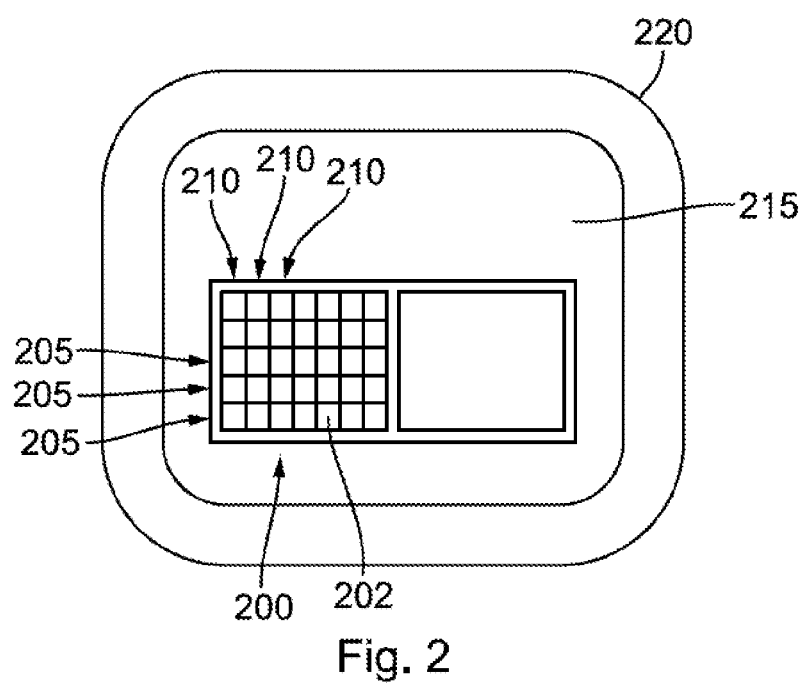
FIG. 2 is an overhead view of an array of MEMS microphones of the type of FIG. 1 positioned on a film frame.

As shown in FIG. 2, MEMS microphones 202 are constructed as part of an array 200 that includes a plurality of top-ported MEMS microphones 100 or a plurality of bottom-ported MEMS microphones 150. The array 200 is built onto a single wafer of silicon that forms the substrate 115 for each MEMS microphone 202 in the array 200. The MEMS microphones 100 in the array 200 are arranged in rows 205 and columns 210. During manufacturing, the array 200 is coupled to a film 215, which is attached to a film frame 220. The film 215 contains an adhesive and adheres to the top surface 125 of each lid 105 and holds the array 200. The film frame 220 keeps the array 200 of non-singulated MEMS microphones steady during a process of singulation. The singulation process divides the substrate 115 between each MEMS microphone 202 and creates a plurality of individual microphone packages. After singulation, each MEMS microphone 202 is held in place by the film 215. Because the top surface 125 of the lid 105 of each MEMS microphone 202 is attached to the film 215, the acoustic port 120 of each MEMS microphone 202 is covered by the film 215 prior to singulation. The film 215 prevents debris from entering the acoustic port 120 during singulation.

Figure 3A:
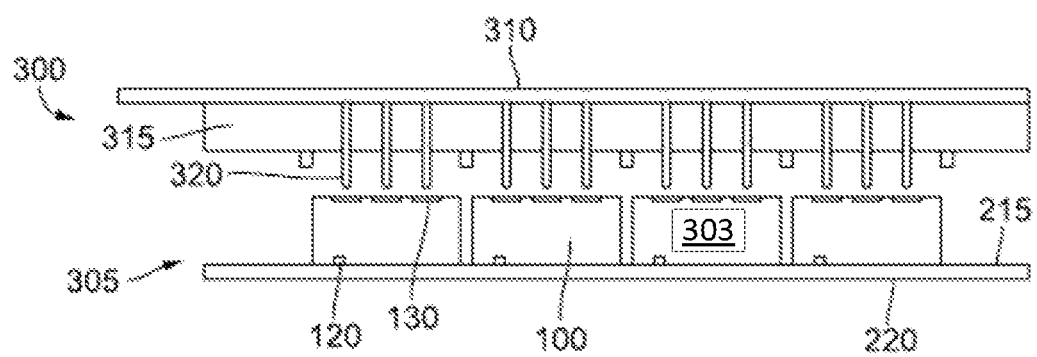
FIG. 3A is a side view of a testing apparatus for the array of MEMS microphones illustrated in FIG. 2.

FIG. 3A illustrates an exemplary testing arrangement 305 for top-ported MEMS microphones 100 including the film frame 220 and a testing apparatus 300. The film 215 holds each top-ported MEMS microphone 100 with the acoustic port 120 positioned to face the film 215 and the contact pads 130 positioned to face the testing apparatus 300. The testing apparatus 300 includes a printed circuit board (PCB) 310 and an alignment socket 315. The PCB 310 provides power, ground, and signal connections to the alignment socket 315. The alignment socket 315 includes pogo pins 320 that are electrically connected to the PCB 310. The pogo pins 320 are configured to electrically connect to the contact pads 130 on each top-ported MEMS microphone 100. During testing, the film frame 220 is positioned such that the pogo pins 320 align with the contact pads 130. The pogo pins 320 provide power, ground, and signal connections to the array 200. In one configuration, the film frame 220 is automatically positioned and aligned to the testing apparatus 300 while the testing apparatus 300 is held stationary. In another configuration, the testing apparatus 300 is automatically positioned and aligned while the film frame 220 is held stationary. The positioning and alignment are performed using robotics and sensors (not shown).

Figure 3B:
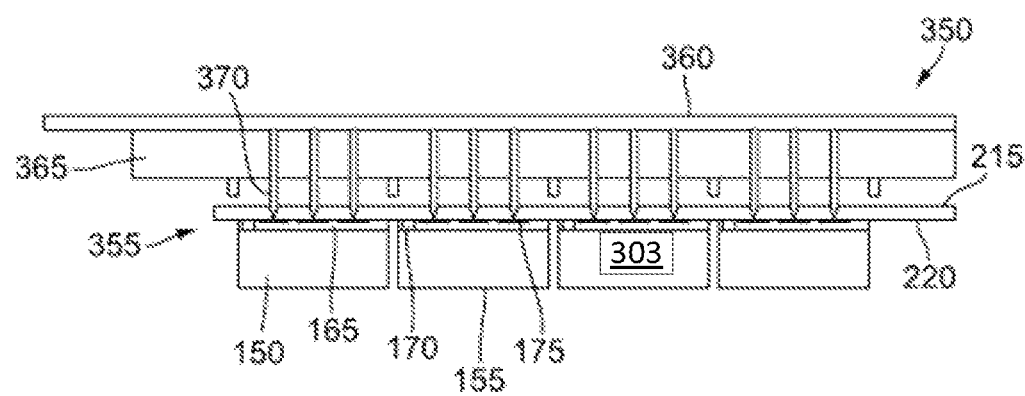
FIG. 3B is a side view of another testing apparatus for the array of MEMS microphones illustrated in FIG. 2.

FIG. 3B illustrates an embodiment of a testing arrangement 355 for the bottom-ported MEMS microphones 150. As in the above configuration, a testing apparatus 350 includes a PCB 360 and an alignment socket 365. The alignment socket 365 includes pogo pins 370 that are electrically connected to the PCB 360. During testing, the pogo pins 370 are configured to electrically connect to the contact pads 175 on each bottom-ported MEMS microphone 150. Unlike in the testing arrangement 305 above, the film 215 is positioned between the testing apparatus 350 and the bottom-ported MEMS microphones 150. The film 215 holds each bottom-ported MEMS microphone 150 with the acoustic port 170 and the contact pads 175 positioned to face the film 215. This results in the contact pads 175 being covered by the film 215. During testing, the pogo pins 370 pierce through the film 215 in order to make electrical contact with the contact pads 175. Alternatively, holes can be pre-punched through the film at the location of the contact pads 175 prior to testing.

Figure 4:
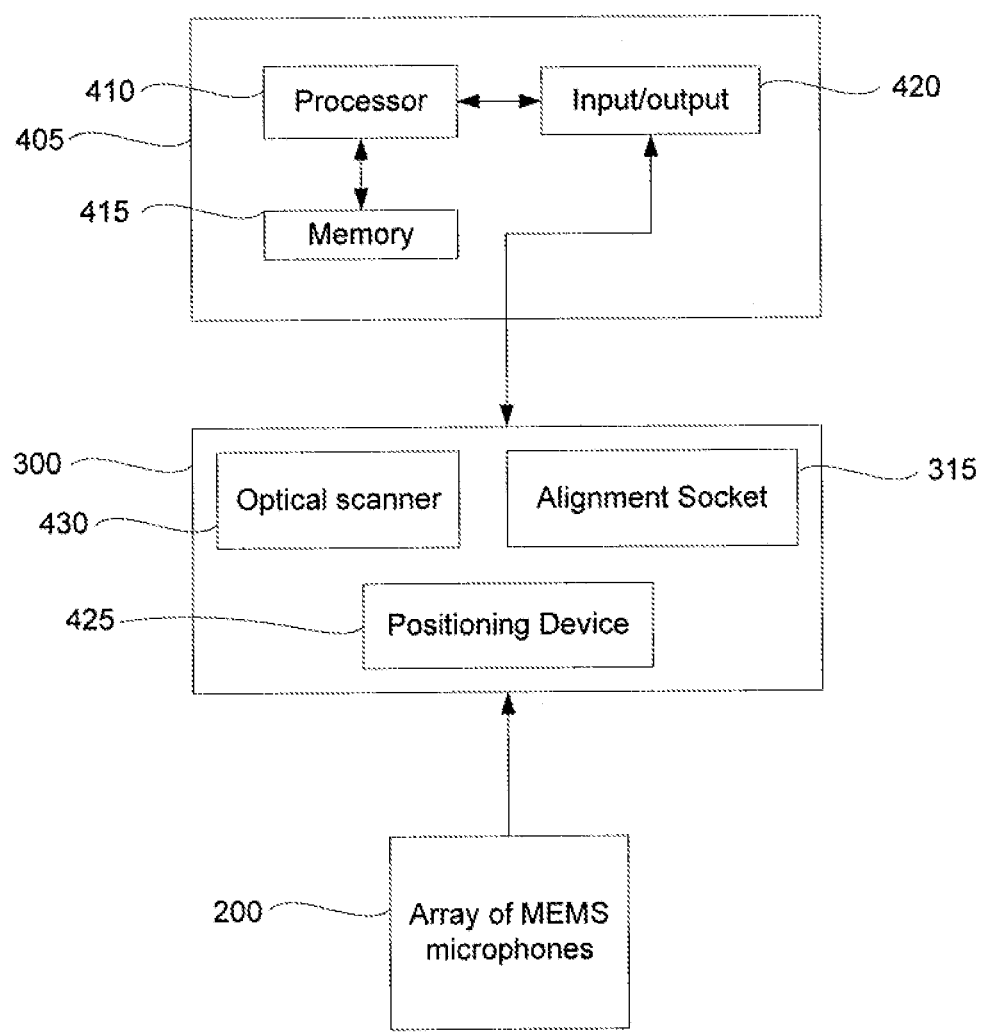
FIG. 4 is a block diagram of a control unit for the testing apparatus of FIG. 3A and of FIG. 3B.

FIG. 4 is a block diagram illustrating one construction of a microphone testing system. The microphone testing system is configured to implement the testing arrangement 305 and the testing arrangement 355. A control unit 405 includes a processor 410, a memory 415, and an input/output module 420. The processor 410 is communicatively connected (for example, electrically connected) to a variety of modules or components of the control unit 405. For example, the illustrated processor 410 is connected to the memory 415 and the input/output module 420. The control unit 405 includes combinations of hardware and software that are operable to, among other things, control the operation of the microphone testing system. The control unit 405 includes a plurality of electrical and electronic components that provide power, operational control, and protection to the components and modules within the control unit 405, the microphone testing system, or both. The memory 415 includes, for example, a program storage area and a data storage area. The control unit links identification data and noise performance data in the data storage area. The program storage area and the data storage area can include combinations of different types of memory, such as read-only memory ("ROM") and random access memory ("RAM"). The memory 415 stores, among other things, information about each MEMS microphone 202. For example, the memory 415 stores (i.e., records) the output noise signal of each of the MEMS microphones 202 and threshold values for acceptable output noise levels.

The control unit 405 is connected to the testing apparatus 300 or the testing apparatus 350 (not shown). The control unit is connected to a positioning device 425, and in some constructions, an optical scanner 430. The positioning device 425 holds the film frame 220 and the alignment socket 315 in position while the testing process is performed. The positioning device 425 is configured to test multiple MEMS microphones 202 simultaneously. As shown in the testing arrangement of FIG. 3, the alignment socket 315 contains multiple pogo pins 320 that connect to a plurality of contact pads 130. The alignment socket 315 may connect to a single row 205 or a single column 210 of the array 200. Each row 205 or column 210 may be tested simultaneously before the positioning device 425 moves the alignment socket 315 or the film frame 220 to the next row 205 or column 210. Alternatively, the alignment socket 315 may connect to all of the contact pads 130 on the array 200 simultaneously. In other constructions, the alignment socket 315 connects to the contact pads 130 in alternating orders or positions. In this way, the testing process may be performed faster than prior methods or be simplified in comparison to prior methods depending on the particular needs of the testing process. In some constructions, the optical scanner 430 scans a barcode 303 on each MEMS microphone 202 to obtain a unique identification number for that MEMS microphone 202. The testing apparatus 300 is configured to transmit an output signal received from each MEMS microphone 202 to the control unit 405 for analysis.

FIG. 5 is a flowchart illustrating one exemplary process for noise testing each MEMS microphone 202 on the array 200. Based on commands from the control unit 405, the positioning device 425 aligns the film frame 220 with the testing apparatus 300 (step 405). The testing apparatus 300 and at least one MEMS microphone 202 are electrically connected via the contact pads 130 and the pogo pins 320. The testing apparatus 300 supplies power, ground, and microphone output connections to at least one MEMS microphone 202 (step 410). The control unit 405 receives the output signal of each MEMS microphone 202 (step 415). The control unit 405 measures the noise level in the output signal of each MEMS microphone 202 (step 420). The control unit 405 determines the position of each MEMS microphone 202 within the array 200 and stores position data with noise level data for each MEMS microphone 202 (step 425). The control unit 405 determines if there are any remaining MEMS microphones 202 to test on the array 200, and if so, repeats steps 410 through 425 for the remaining MEMS microphones 202 (step 430). Once each MEMS microphone 202 on the array 200 has been tested, the film frame 220 is removed from the testing apparatus 300 and a new film frame is inserted (step 435) (i.e., a new batch). Each MEMS microphone 202 is removed from the film frame 220 and sorted (step 440). Each individual MEMS microphone 202 undergoes further processing. It should be noted that the steps illustrated in FIGS. 4 and 5 refer to components of the top-ported MEMS microphone 100; however, the steps may be performed in the same manner as with bottom-ported MEMS microphones 150 with the testing arrangement 350 in FIG. 3B.

The noise testing analyzes the output of each MEMS microphone 202 without applying sound to the acoustic ports 120, 170. The measured output signal with no applied sound provides test data, which is analyzed to determine a level of noise that the MEMS microphone 202 generates. For example, the noise test determines noise due to the electronics (e.g., the microphone die 110) and noise due to the physical characteristics of the microphone package. Inadvertent or unwanted sound that is present during noise testing can interfere with noise testing for the MEMS microphone 202. Unwanted sound (background noise) can originate from a number of different sources e.g., talking, traffic, facility equipment, vibrations, etc. Background noise introduced into the acoustic ports 120, 170 of the MEMS microphones 202 produces an output signal representative of the background noise. The output signal due to background noise may prevent an accurate determination of the noise due to the MEMS microphones 202.

In the testing arrangement illustrated in FIGS. 3A and 3B, the film 215 obstructs the acoustic ports 120, 170 during the noise testing. The film 215 provides attenuation to sounds entering the acoustic ports 120, 170 and thus, reduces the level of the background noise that enters the MEMS microphone 202. This attenuation is beneficial because it reduces the noise level due to background noise on the output signal of the MEMS microphone 202 to a level that does not interfere with noise determination of the MEMS microphone 202. Film-based attenuation may lower testing costs that are associated with other means of noise reduction. For example, film-based attenuation may allow noise testing in areas with a higher level of background noise than is possible without attenuation.

In some constructions, noise testing includes identifying each MEMS microphone 202 by a component number rather than just by position. The identification data is then correlated with the noise data. Identification may include, for example, a barcode 303 on each MEMS microphone 202 that is read by the optical scanner 430. Alternatively, each MEMS microphone 202 is removed from the film frame 220 and assorted in such a way (e.g., in a parts bin) as to maintain positional information throughout the remaining manufacturing and testing process. In different constructions, determination of positional information or component identification may occur at various points in the testing process. Similarly, correlation between positional information or identification data with the associated noise data may occur at different steps of the testing process.

Once noise testing is complete, each MEMS microphone 202 undergoes further testing. For example, each MEMS microphone 202 undergoes signal testing (i.e., measuring the output signal under a test tone). Since attenuation is undesirable for signal testing, each MEMS microphone 202 is removed from the film 215 prior to signal testing. The signal test data when combined with the noise test data allows determination of a signal-to-noise ratio (SNR). Each MEMS microphone 202 that does not meet or exceed a threshold level for SNR is rejected (e.g., discarded).

Thus, the invention provides, among other things, a method and a system for noise testing a MEMs microphone during manufacture by using a film to obstruct the acoustic ports of the microphone to attenuate external sounds during noise testing. Various features and advantages of the invention are set forth in the following claims.

What is claimed is:

1. A method for noise testing a micro-electro-mechanical system (MEMS) microphone, the method comprising:
   positioning a film frame in a testing apparatus, the film frame including a film adhered to an array of MEMS microphones and covering an acoustic port of each MEMS microphone in the array of MEMS microphones;
   connecting an alignment socket to a substrate of the MEMS microphones, the alignment socket coupling to one or more contact pads of each MEMS microphone in the array of MEMS microphones to provide a power connection and a MEMS microphone output connection to each MEMS microphone;
   measuring, at a control unit, an output signal from the MEMS microphone output connection to obtain noise performance data; and
   recording the noise performance data in memory.

2. The method of claim 1, wherein positioning the film frame in the testing apparatus further includes positioning the film frame including the film adhered to an array of singulated, top-ported MEMS microphones, and the method further comprising:
   coupling an array of non-singulated, top-ported MEMS microphones to the film such that the lid of each MEMS microphone is adhered to the film; and
   singulating the array of non-singulated, top-ported MEMS microphones, wherein the film holds the array in place after singulation.

3. The method of claim 2, wherein coupling the array of non-singulated, top-ported MEMS microphones onto a film includes covering the acoustic ports with the film such that the film attenuates sound entering the acoustic port.

4. The method of claim 2, further comprising mounting multiple arrays of non-singulated, top-ported MEMS microphones onto the film such that the multiple arrays are tested as one batch.

5. The method of claim 1, further comprising:
   scanning a barcode located on each of the MEMS microphones to obtain identification data for each of the MEMS microphones;
   matching the identification data with the noise performance data corresponding to each of the MEMS microphones; and
   storing the identification data with the noise performance data in memory such that the noise performance data is attached to the identification data.

6. The method of claim 1, further comprising:
   removing each MEMS microphone of the array of MEMS microphones from the film; and
   correlating identification data of each MEMS microphone of the array of MEMS microphones with the noise performance data particular to each of the MEMS microphones.

7. The method of claim 1, wherein connecting an alignment socket to a substrate of the MEMS microphones includes aligning pogo pins to corresponding contact pads on the MEMS microphone.

8. The method of claim 1, further comprising:
   connecting the alignment socket to the substrate of each MEMS microphone that is positioned in a first column of the array; and
   repeatedly connecting the alignment socket to the substrate of each MEMS microphone that is positioned in a next column of the array until all the MEMS microphones on the array are tested.

9. The method of claim 1, further comprising:
connecting the alignment socket to the substrate of each MEMS microphone that is positioned in a first row of the array; and
repeatedly connecting the alignment socket to the substrate of each MEMS microphone that is positioned in the next row of the array until all the MEMS microphones on the array are tested.

10. The method of claim 1, further comprising:
removing each of the MEMS microphones from the film;
measuring the output signal to obtain a signal-to-noise ratio of each of the MEMS microphones;
comparing the signal-to-noise ratio of each of the MEMS microphones to a signal-to-noise ratio threshold level; and
discarding each of the MEMS microphones that do not exceed the signal-to-noise ratio threshold level.

11. The method of claim 1, wherein the MEMS microphones are bottom-ported MEMS microphones.

12. A system for testing noise of a microelectromechanical (MEMS) microphone comprising:
an array including a plurality of MEMS microphones each with a lid and an acoustic port;
a thin film attached to a film frame, the film adhering to the lid of each of the plurality of MEMS microphones and covering the acoustic port of each MEMS microphone;
a testing apparatus including an alignment socket configured to connect to a plurality of contact pads located on a substrate of the MEMS microphones, the alignment socket providing power connections and output connections to the MEMS microphones; and
a control unit configured to measure the output signal from the MEMS microphone to obtain noise performance data.

13. The system of claim 12, wherein the film attenuates sound that enters the acoustic port of the MEMS microphone.

14. The system of claim 12, further comprising:
a barcode located on each of the MEMS microphones that provides identification data;
an optical scanner included with the testing apparatus that is configured to read the barcode; and
a data storage structure configured to store the identification data and the noise performance data,
wherein the identification data and the noise performance data is linked by the control unit.

15. The system of claim 12, further comprising:
pogo pins configured to connect to contact pads on the MEMS microphone;
a printed circuit board connected to the pogo pins and the control unit, the printed circuit board configured to transmit power to the MEMS microphones and an output signal to the control unit.

16. The system of claim 12, further comprising:
a plurality of columns of MEMS microphones on the array,
wherein the alignment socket connects firstly to a first column of the array and secondly to a second column of the array, and
wherein the control unit is configured to control the alignment socket such that each of the plurality of columns is tested.

17. The system of claim 12, further comprising:
a plurality of rows of MEMS microphones on the array,
wherein the alignment socket connects firstly to a first row of the array and secondly to a second row of the array, and
wherein the control unit is configured to control the alignment socket such that each of the plurality of rows is tested.

18. The system of claim 12, further comprising:
a plurality of arrays of top-ported MEMS microphones pressed onto the film such that the lids are coupled to the film.

19. The system of claim 12, wherein the control unit is configured to
measure the output signal to obtain a signal-to-noise ratio of each of the MEMS microphones;
compare the signal-to-noise ratio of each of the MEMS microphones to a signal-to-noise threshold level; and
identify the MEMS microphones that exceed the signal-to-noise threshold level.

* * * * *